US006218283B1

(12) United States Patent
Park et al.

(10) Patent No.: US 6,218,283 B1
(45) Date of Patent: Apr. 17, 2001

(54) METHOD OF FABRICATING A MULTI-LAYERED WIRING SYSTEM OF A SEMICONDUCTOR DEVICE

(75) Inventors: Joo-Sung Park, Sungnam; Chan-Hyoung Cho, Anyang, both of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/389,026

(22) Filed: Sep. 2, 1999

(30) Foreign Application Priority Data

Sep. 3, 1998 (KR) .................................................. 98-36319

(51) Int. Cl.⁷ .............................................. H01L 21/4763
(52) U.S. Cl. ........................ 438/622; 438/625; 438/627; 438/640; 438/687; 438/688
(58) Field of Search .................................... 438/618, 622, 438/624–629, 636–640, 687–688, 672–673, 675, 701, 713

(56) References Cited

U.S. PATENT DOCUMENTS

| | | | |
|---|---|---|---|
| 5,106,461 | * | 4/1992 | Volfson et al. ........................ 438/667 |
| 5,312,775 | * | 5/1994 | Fujii et al. ............................ 438/625 |
| 5,470,790 | * | 11/1995 | Myers et al. .......................... 438/625 |
| 5,864,179 | * | 1/1999 | Koyama ................................ 257/767 |
| 6,087,250 | * | 7/2000 | Hyakutake ............................ 438/622 |
| 6,110,819 | * | 8/2000 | Colgan et al. ........................ 438/625 |
| 6,127,265 | * | 10/2000 | Tomita ................................. 438/637 |

* cited by examiner

Primary Examiner—Charles Bowers
Assistant Examiner—Thanh Nguyen
(74) Attorney, Agent, or Firm—The Law Offices of Eugene M. Lee, P.L.L.C.

(57) ABSTRACT

A method of constructing a multi-layered wiring system of a semiconductor device is provided, wherein the method includes steps of: sequentially forming first and second conductive layers on a semiconductor unit board having the first insulation layer; forming an anti-reflective layer in a structure of Ti/TiN deposition layers by means of a sputter device having a collimator on the second conductive layer; selectively etching predetermined portions of the anti-reflective layer, the second conductive layer and the first conductive layer to expose predetermined portions of the first insulation layer to form a metal wire; forming the second insulation layer at the front side of the aforementioned structure; forming a via hole by dry-etching predetermined portions of the second insulation layer and the anti-reflective layer to expose predetermined portions on the surface of the metal wire with tapered parts of anti-reflective layer remaining along the edges of the bottom thereof; performing a wet etching process to remove the polymer component from the via hole; performing a RF sputter etching process to remove a natural oxide layer grown on the portions exposed on the surface of the metal wire and the tapered parts of the anti-reflective layer; and forming a conductive plug inside the via hole.

38 Claims, 5 Drawing Sheets

METHOD OF FABRICATING A MULTI-LAYERED WIRING SYSTEM OF A SEMICONDUCTOR DEVICE

BACKGROUND OF THE INVENTION

1. Field of the Invention

The present invention relates to a method of fabricating a semiconductor device, and more particularly to a method of fabricating a multi-layered wiring system of a semiconductor device. The method reduces defects that occur during formation of the device and thereby improves reliability of the semiconductor device.

2. Description of the Related Art

As submicron technology advances, there is a demand for making ever smaller chips having a finer pattern for the metal wiring system. Therefore, in the fabrication of semiconductor devices, a desperate need has arisen for a multi-layered wiring process which integrates W-plug, Al-flow and chemical mechanical polishing (CMP) processes.

FIGS. 1 through 4 are diagrams illustrating the sequential production procedures of a conventional method of fabricating a multi-layered wiring system of a semiconductor device. The conventional method is described in four sequential steps with reference to the accompanying drawings. For example, the production procedures of a semiconductor device will be described below: wherein a multiple metal wiring system is made in a fine pattern of less than 0.6 $\mu$m, and a via hole (h) is designed for electrically connecting between the metal wires in a fine width of less than 0.5 $\mu$m, thereby resulting in an aspect ratio of over 2.

At the first step, as shown in FIG. 1, a first insulation layer 12 of 0.5–2.0 $\mu$m in thickness is formed by means of a CVD process and a heat treatment process on the semiconductor substrate 10 which includes unit elements (not shown) such as a transistor and a capacitor.

The first insulation layer 12 is constructed in a BPSG single layer structure, three deposition layer structure such as PEOX/USG/PE-TEOS, or four deposition layer structure such as PEOX/O3-TEOS/PE-TEOS/PEOX. Alternatively, the uppermost layer of PEOX can be omitted in the case of the four deposition layer structure.

At the second step, as shown in FIG. 2, to improve adhesion between layers, a first conductive layer 14 of a Ti/TiN deposition layer structure is positioned on the first insulation layer 12. A second conductive layer 16 of 5000–8000 Å in thickness is made of aluminum (Al) alloy and is formed on the first conductive layer 14 by means of a sputter deposition process and a heat treatment process. Then, a first anti-reflective layer 18 (ARL) of Ti and TiN is formed by a sputter deposition process on a second conductive layer 16. The Ti and TiN of the first conductive layer 14 are respectively 200 Å and 700 Å in thickness. The first anti-reflective layer 18 is 200–600 Å in thickness.

At the third step, as shown in FIG. 3, a photosensitive layer pattern (not shown) for a restricting metal wiring system is used as a mask for sequentially etching the first anti-reflective layer 18, the second conductive layer 16 and the first conductive layer 14. The first metal wire 16a has the anti-reflective layer 18 at the upper portion thereof and the first conductive layer 14 at the lower portion thereof. Then, a second insulation layer 20 of 1.0–2.5 $\mu$m in thickness is formed on the first insulation layer 12 and the first metal wire 16a by means of a CVD process. Then, a CMP treatment (or an etch back process) is carried out for planarization of the second insulation layer 20. To expose predetermined portions on the surface of the first metal wire 16a, predetermined portions of the second insulation layer 20 are dry-etched to make a via hole (h) therein. In order to remove the polymer component (for example, a multiple polymerized complex of TiFx or AlFx) formed in the course of the dry-etching process, a wet etching process is carried out. The dry-etching of the second insulation layer 20 and the first anti-reflective layer 18 is performed with an etching gas composed of $CHF_3$: $CF_4$ at the ratio of 1:0.4. The wet etching process, for removing the remaining polymer component, is performed using an $HNO_3$ based solution as the etching liquid (etchant).

At the fourth step, as shown in FIG. 4, a sputter etching process is carried out by using a radio frequency bias (hereinafter referred to as RF sputter etch) to remove a natural oxide layer ($Al_2O_3$) grown in the portions exposed on the surface of the first metal wire 16a. The RF sputter etching process is performed to etch the oxide layer of about 400 Å in thickness with an RF power of 800 Watts. The amount of the oxide layer to be etched is not the value set with reference to the natural oxide layer grown on the surface of the first metal wire 16a, but the value set with reference to the oxide layer ($SiO_2$). A barrier metal layer 22 of Ti/TiN is formed inside the via hole (h) and on the first metal wire 16a by means of a sputtering apparatus device having a collimator. A conductive layer 24 of tungsten (W) is formed by a CVD process at the front side to fill the via hole (h). A CMP treatment (or, etch back) is carried out on the conductive layer and the barrier metal layer until the surface of the second insulation layer 20 is exposed, thus forming a conductive plug 24 in the via hole (h).

A third conductive layer 26 of Ti is formed on the conductive plug 24 and the second insulation layer 20 to improve adhesion between layers. A fourth conductive layer of Al alloy and a second anti-reflective layer 30 of TiN are sequentially formed on top of the third conductive layer 26. Then, a photoresist layer pattern (not shown) for restricting the metal wiring system is used as a mask to sequentially etch the second anti-reflective layer 30, the fourth conductive layer and the third conductive layer 26, to form second metal wire 28 with anti-reflective layer 30 at the upper portion thereof and the third conductive layer 26 at the lower portion thereof. The second anti-reflective layer 30 is 200–600 Å in thickness.

There are two problems in the aforementioned procedures (i.e., when a via hole (h) of a multi-layered wiring system in a semiconductor device is constructed as shown in FIG. 4). First, if the wet etching process is performed to remove the polymer component after formation of the via hole (h), some parts of the first metal wire 16a can be simultaneously etched along with the polymer component. In other words, the first metal wire 16a inside the first anti-reflective layer 18, positioned below the via hole (h), is also partially etched in the course of the wet etching process. As a result, a concave portion (part I in FIG. 3) is formed inside the anti-reflective layer 18 at the edges of the via hole (h). Thus, the via hole (h) has a deformed profile, which leads to a defective connection between the barrier metal layer 22 and the first metal wire 16a because the concave portion (I) is not properly filled to form the barrier metal layer 22.

Secondly, if the concave portion (I) is formed inside the barrier metal layer 18 below the via hole (h) in the course of the wet etching process, it can be difficult to completely remove the polymer component at the concave portion (I), thereby forming a shadow point where the polymer component remains. When these problems occur, the contact resistance increases in the via hole, which thereby lowers the reliability of the semiconductor device.

SUMMARY OF THE INVENTION

The present invention is provided to solve the aforementioned problems, and one feature of the present invention is to provide a method of fabricating a multi-layered wiring system of a semiconductor device by forming an anti-reflective layer in the structure of Ti/TiN deposition layer with a sputter device having a collimator to reduce fabrication defects (for example, a concave portion inside the anti-reflective layer below the via hole, or a deformed portion called the shadow point in the via hole) to improve the reliability of the semiconductor element.

In accordance with one feature of the present invention, a method is provided for constructing a multi-layered wiring system of a semiconductor device, wherein the method comprises steps of: sequentially forming the first and second conductive layers on the semiconductor substrate having the first insulation layer; forming an anti-reflective layer in the structure of Ti/TiN deposition layer by means of a sputter device having a collimator on the second conductive layer; selectively etching predetermined portions of the anti-reflective layer, the second conductive layer and the first conductive layer to expose predetermined portions of the first insulation layer to form a metal wire having the structure of the anti-reflective layer/the second conductive layer/the first conductive layer; forming a second insulation layer on the whole surface of the resulting structure; forming a via hole by dry-etching predetermined portions of the second insulation layer and the anti-reflective layer to expose predetermined portions on the surface of the metal wire with a tapered part of anti-reflective layer remaining along the edges of the bottom thereof; performing a wet etching process to remove the remaining polymer component from the via hole; performing a RF sputter etching process to remove a natural oxide layer grown on the portions exposed on the surface of the metal wire and the tapered part of the anti-reflective layer; and forming a conductive plug inside the via hole.

In the present invention, the anti-reflective layer of the Ti/TiN deposition layer structure can be formed by an IMP (ionized metal plasma) method instead of using a sputter device having a collimator. It is preferred that the Ti and TiN be made to 50–500 Å and 100–1500 Å in thickness, respectively.

A dry-etching process of the second insulation layer and the anti-reflective layer is preferably carried out with etching gas of $CHF_3$: $CF_4$ combined at the ratio of 1: (0.5–2.0). On the other hand, the wet etching process preferably is carried out with an $HNO_3$ based solution to remove the polymer component. It is preferable that the horizontal distance (X) between the edges and the tapered portions of the via hole be kept within the range of 100–800 Å in the course of the wet etching process.

It is also preferable that the amount to be etched herein should be 100–1000 Å in thickness with reference to an oxide layer of $SiO_2$ in the course of the RF sputter etching process with an RF power of 500–1500 Watts.

When a multi-layered wiring system of a semiconductor device is constructed with the aforementioned method, the anti-reflective layer positioned below the via hole does not have a vertical structure, but a tapered shape, formed in the course of the etching processes of the second insulation layer and the anti-reflective layer. The horizontal portions of this tapered structure act to prevent or reduce undesirable etching of the metal wire under the anti-reflective layer in the course of the wet etching process to remove the polymer component. As a result, concave portions are not formed below the via hole, thereby preventing defective products.

DETAILED DESCRIPTION OF THE INVENTION

Korean patent application no. 98-36319, filed on Sep. 3, 1998, is hereby incorporated by reference as if fully set forth herein.

A specific embodiments of the invention is described in detail with reference to the accompanying drawings. In accordance with the preferred embodiment of the present invention, an anti-reflective layer of a Ti/TiN deposition layer structure is formed by using a sputter device having a collimator (or IMP method) and a dry-etching process to form a via hole is carried out with etching gas of $CHF_3$: $CF_4$ combined at the ratio of 1: X (where X is a value set within the range of 0.5–2.0), to prevent defects in the formation of the via hole and thereby improve the reliability of the multi-layered wiring system of the semiconductor device.

FIGS. 5 through 9 are diagrams illustrating a method of sequentially constructing a multi-layered wiring system of a semiconductor device. The method is described in five sequential steps with reference to the accompanying drawings. For example, the method may be used where a multiple metal wiring system is made in a fine pattern of less than 0.6 $\mu$m, and the via hole (h) for electrically connecting between the metal wires is designed with the fine width of less than 0.5 $\mu$m to thereby have an aspect ratio of over 2.

Figure 5:
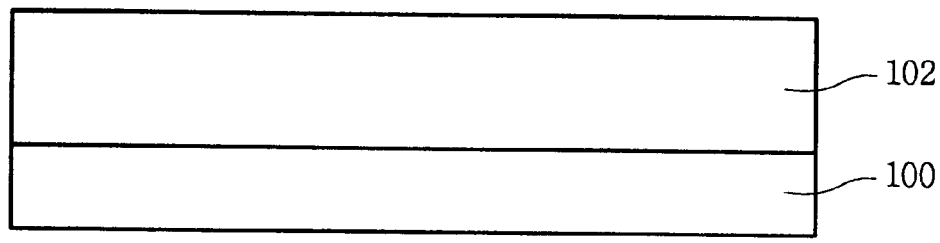
FIGS. 5 through 9 are diagrams illustrating a method of fabricating a multi-layered wiring system of a semiconductor element in accordance with the present invention.

At the first step, as shown in FIG. 5, a first insulation layer 102 of 0.5–2.0 $\mu$m in thickness is formed by means of a CVD process and a heat treatment process on a semiconductor unit board 100, which includes unit elements (not shown) such as a transistor and a capacitor. A first insulation layer 102 is formed, in a single layer structure such as BPSG, a three deposition layer structure such as PEOX/USG/PE-TEOS, or a four deposition layer structure such as PEOX/O3-TEOS/PE-TEOS/PEOX. The uppermost layer of PEOX can be omitted in the case of the four deposition layer structure.

Figure 6:
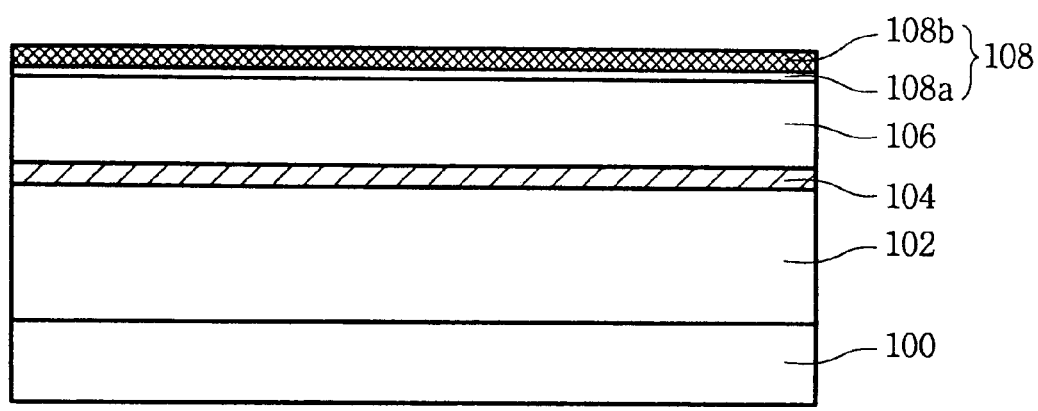

At the second step, as shown in FIG. 6, a first conductive layer 104 of Ti/TiN deposition layer structure is positioned on the first insulation layer 102 to improve adhesion between layers. A second conductive layer 106 is positioned on the first conductive layer 104 by means of a sputter deposition process and a heat treatment process. Preferably, the second conductive layer 106 is 5000–8000 Å in thickness and made of a Cu alloy. Then, a first anti-reflective layer 108 having a deposition layer structure of Ti 108a/TiN 108b is formed on the second conductive layer 106 by means of a sputter device having a collimator. The first anti-reflective layer 108 can be formed by using an IMP method instead of using a sputter device having a collimator. Preferably, the Ti and TiN layers of the first conductive layer 104 are respectively made of 150–250 Å and 650–750 Å in thickness. The Ti 108a and TiN 108b layers of first anti-reflective layer 108 are respectively 50–500 Å and 100–1500 Å in thickness.

The first anti-reflective layer 108 is formed in a structure of Ti/TiN deposition layers on the second conductive layer 106 to prevent ultraviolet rays from being diffusivly reflected, so that a fine pattern can be formed by the following photolithography processes.

Figure 7:
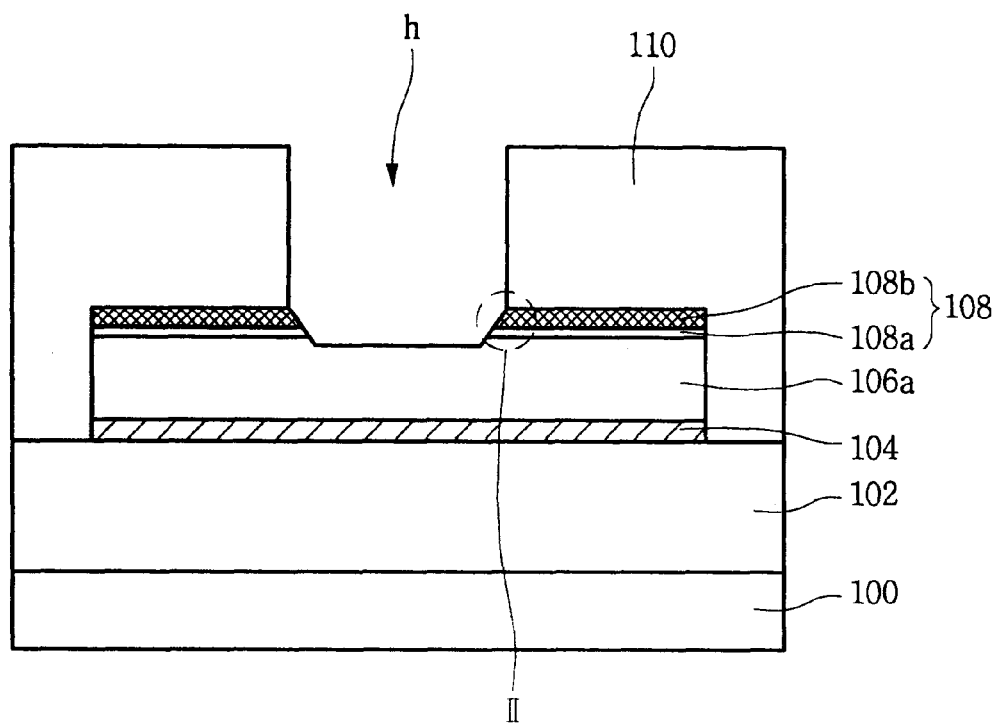

At the third step, as shown in FIG. 7, a photosensitive layer pattern (not shown) for restricting the metal wiring system is formed on the first anti-reflective layer 108 by means of a photo lithography process and is used as a mask for sequentially etching the first anti-reflective layer 108, the second conductive layer 106, and the first conductive layer 104. Therefore, the first metal wire 106a has the anti-reflective layer 108 at the upper portion thereof and the first conductive layer 104 at the lower portion thereof. Then, a second insulation layer 110, preferably of 1.0–2.5 μm in thickness, is made on the first insulation layer 102 including the first metal wire 106a by means of a CVD process. Then, a CMP treatment is carried out to planarize the second insulation layer 110. To expose predetermined portions on the surface of the first metal wire 106a, predetermined portions of the second insulation layer 110 and the first anti-reflective layer 108 are dry-etched, so that a via hole (h), preferably 0.45–0.50 μm in thickness, is made inside the second insulation layer 110. Dry-etching to from the via hole (h) is performed, preferably using etching gas composed of $CHF_3$: $CF_4$ at the ratio of 1: (0.5–2.0). The second insulation layer 110 can be constructed in PEOX/O3-TEOS double layer structure, PETEOS/SOG/PEOX three deposition layer structure, or PEOX/O3-TEOS/PE-TEOS/PEOX four deposition layer structure. The uppermost layer of PEOX can be omitted in the case of the insulation layer 110 having a four deposition layer structure.

If the dry-etching process is carried out in the aforementioned conditions, as shown in FIG. 7, the second insulation layer 110 is etched to form a vertical sectional profile and the first anti-reflective layer 108 is etched to show a tapered sectional profile due to its properties. When the etching process is completed, the tapered shape of the first anti-reflective layer 108 is positioned along edges of the bottom surface of the via hole (h).

Figure 10:
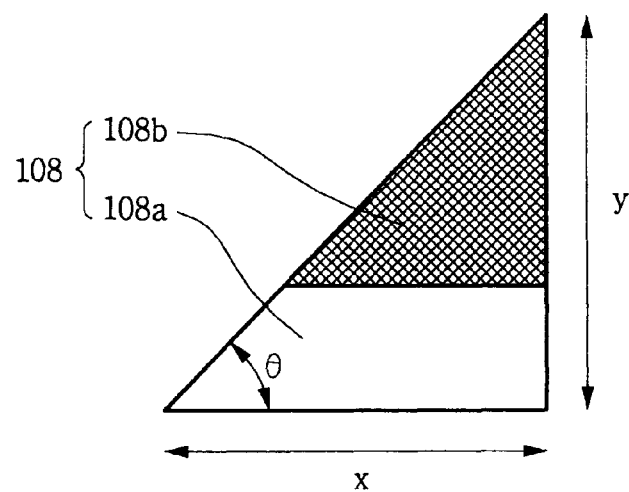
FIG. 10 is an enlarged perspective view for illustrating a principal part, which is represented by symbol II in FIG. 7.

FIG. 10 is an enlarged cross sectional view of a part of the tapered portion of the first anti-reflective layer 108 (the portion represented by reference symbol II in the figure) positioned on the bottom surface of the via hole (h). In FIG. 10, reference symbol X represents the horizontal distance from the side of the via hole (h) to the tapered portion on the anti-reflective layer 108, and reference symbol Y represents a vertical distance, the total thickness of the first anti-reflective layer 108. It is preferable if angle θ corresponding to the vertical distance Y of the first anti-reflective layer 108 is kept within a range of 20–80° by controlling the thickness of Ti 108a and TiN 108b.

Figure 8:
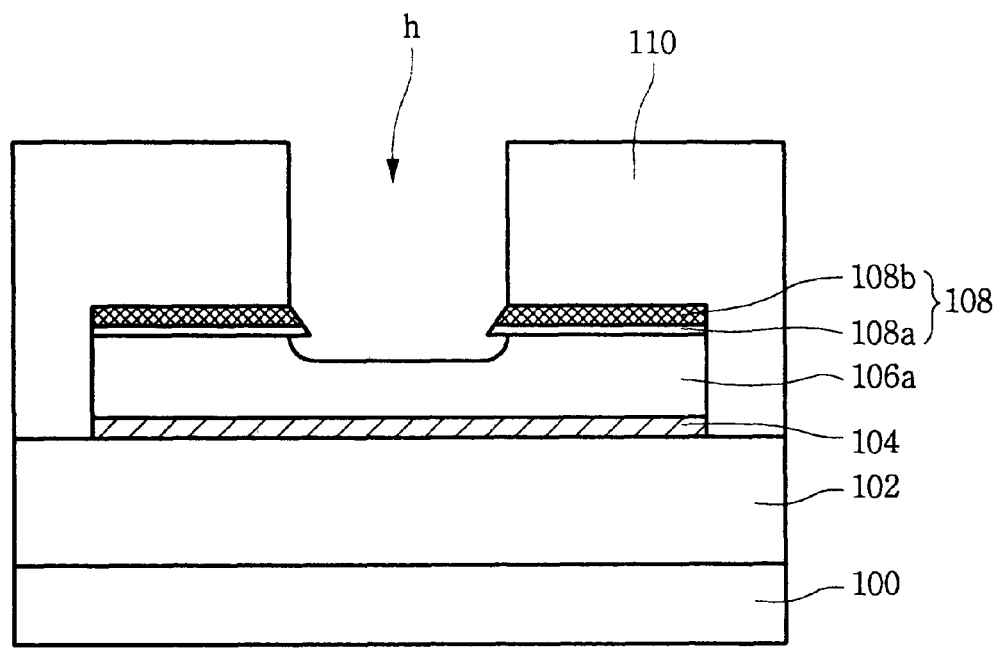

At the fourth step, as shown in FIG. 8, a wet etching process is carried out to remove any polymer component (for example, TiFx, AlFx or CuFx based co-polymerized complex) formed on the second insulation layer 110 and the first anti-reflective layer 108 in the course of the dry-etching process. Preferably, the wet etching process for removing the remaining polymer component is performed in a $HNO_3$ based solution as the etching liquid (etchant).

When the wet etching process is carried out under the aforementioned operational conditions, as shown in FIG. 8, the etching of metal wire 106a does not penetrate further than the horizontal distance X of the tapered portion of first anti-reflective layer 108. Therefore, a concave part is not formed at the lower portion of the via hole (h). Preferably, the horizontal distance X of the first anti-reflective layer 108 is kept within the range of 100–800 Å in the course of the wet etching process. However, the horizontal distance X can vary depending on the size of the via hole (h).

Figure 9:
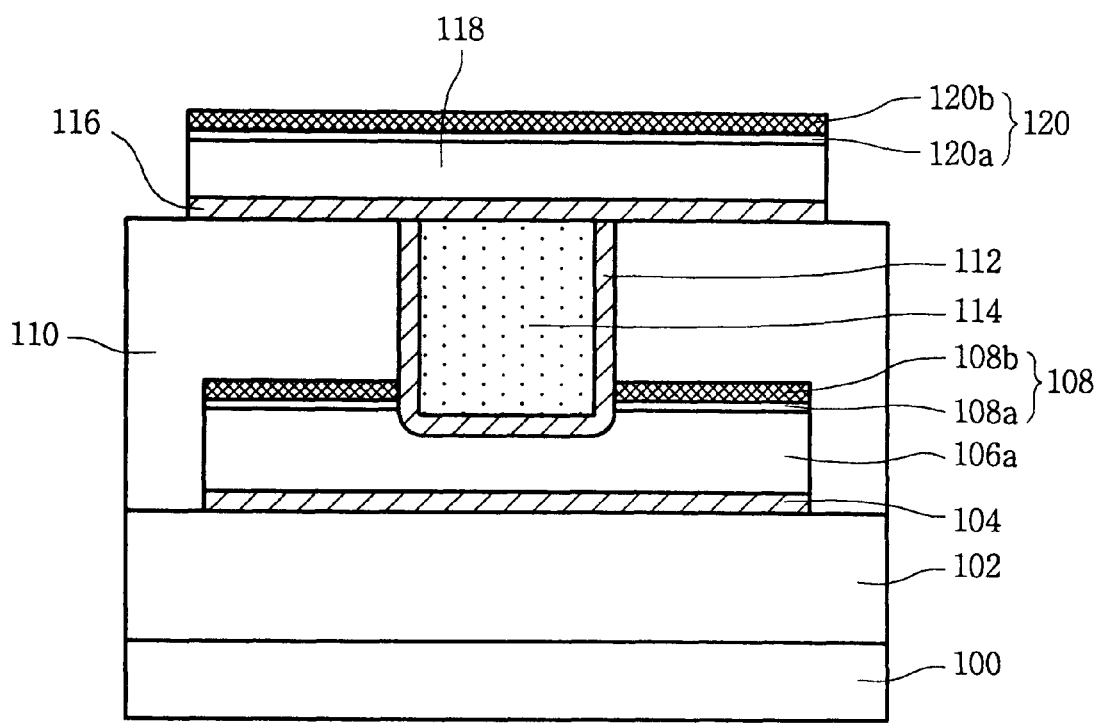

At the fifth step, as shown in FIG. 9, a sputter etching process is carried out with an RF bias to remove the natural oxide layer ($Al_2O_3$ or CuO) grown in the portions exposed on the surface of the first metal wire 106a. Preferably, the RF sputter etching process is performed for etching the oxide layer of about 10–1000 Å in thickness with an RF power of 500–1500 Watts. The amount of the oxide layer to be etched is not a value set with reference to the natural oxide layer grown on the surface of the first metal wire 16a, but a value set with reference to the oxide layer ($SiO_2$). The tapered portions of the first anti-reflective layer 108 are completely removed in the RF sputter etching process. When the RF sputter etching process is completed, a via hole (h) is formed that has a superior sectional profile.

A barrier metal layer 112 of Ti/TiN is made inside the via hole (h) and on the second insulation layer 110 by means of a sputter etching device having a collimator. A conductive layer of W is formed by a CVD process at the front side to fill inside the via hole (h). Until the surface of the second insulation layer 110 is exposed, a CMP treatment (etchback process) is carried out on the conductive layer and the barrier metal layer 112 to form a conductive plug 114 of W in the via hole (h).

A third conductive layer 116 of Ti is formed on the conductive plug 114 and the second insulation layer 110 to improve adhesion between the layers. A fourth conductive layer of Al or Cu alloy is formed on top of the third conductive layer 116, and then a second anti-reflective layer 120 comprising a Ti 120a and TiN 120b deposition layer structure is sequentially formed on top of the fourth conductive layer. Then, a photoresist layer pattern (not shown) for restricting the metal wiring system is used as a mask to sequentially etch the second anti-reflective layer 120, the fourth conductive layer and the third conductive layer 116, to form second metal wire 118 with anti-reflective layer 120 at the upper portion thereof and the third conductive layer 116 at the lower portion thereof. The second anti-reflective layer 120 can be formed using an IMP method or a sputter device having a collimator.

Therefore, the multi-layered wiring system is completed with the first and second metal wires 106a and 118 positioned between the conductive plug 114 for electrical connection, wherein the metal wires 106a and 118 respectively have the anti-reflective layers 108 and 120 at the upper portion thereof and the conductive layers 104 and 116 at the lower portion thereof.

Figure 1:
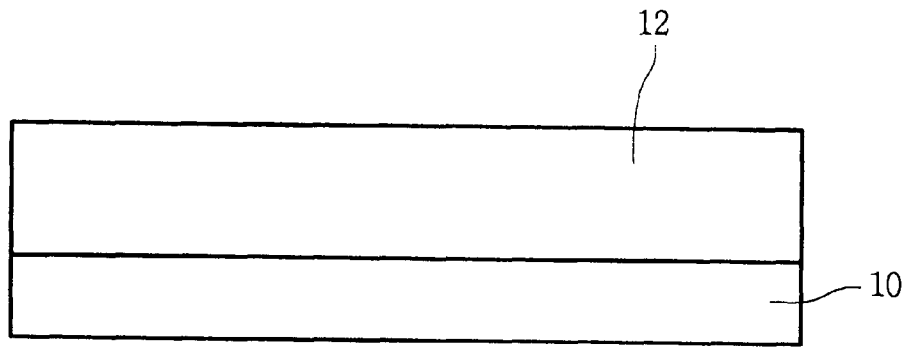
FIGS. 1 through 4 are diagrams illustrating a conventional method of fabricating a multi-layered wiring system of a semiconductor device.
Figure 2:
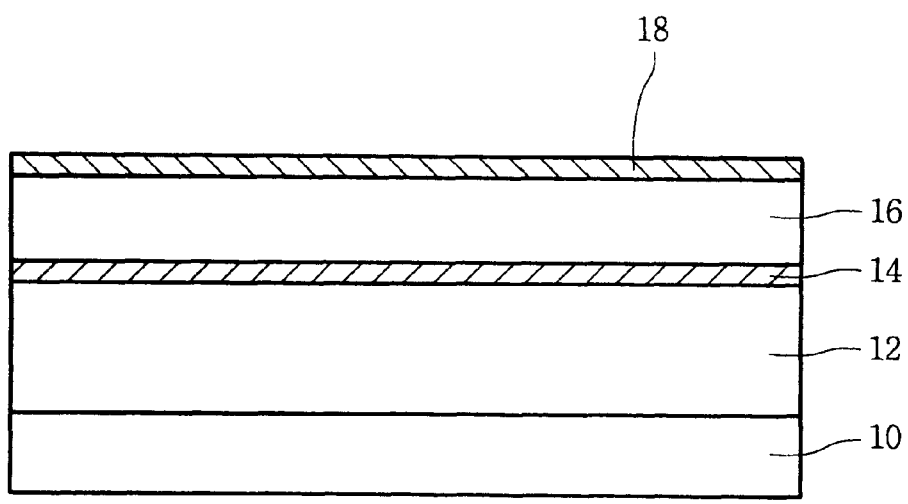
Figure 3:
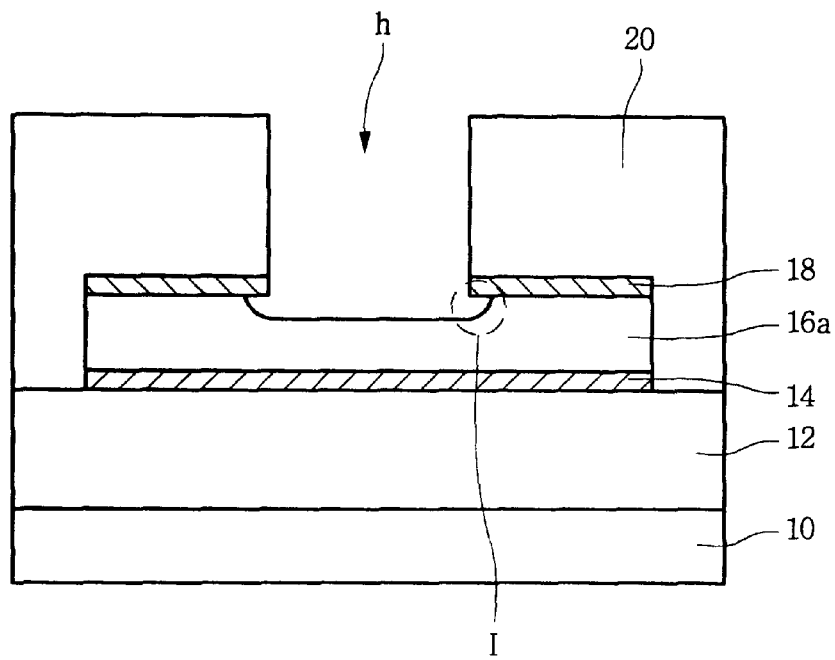
Figure 4:
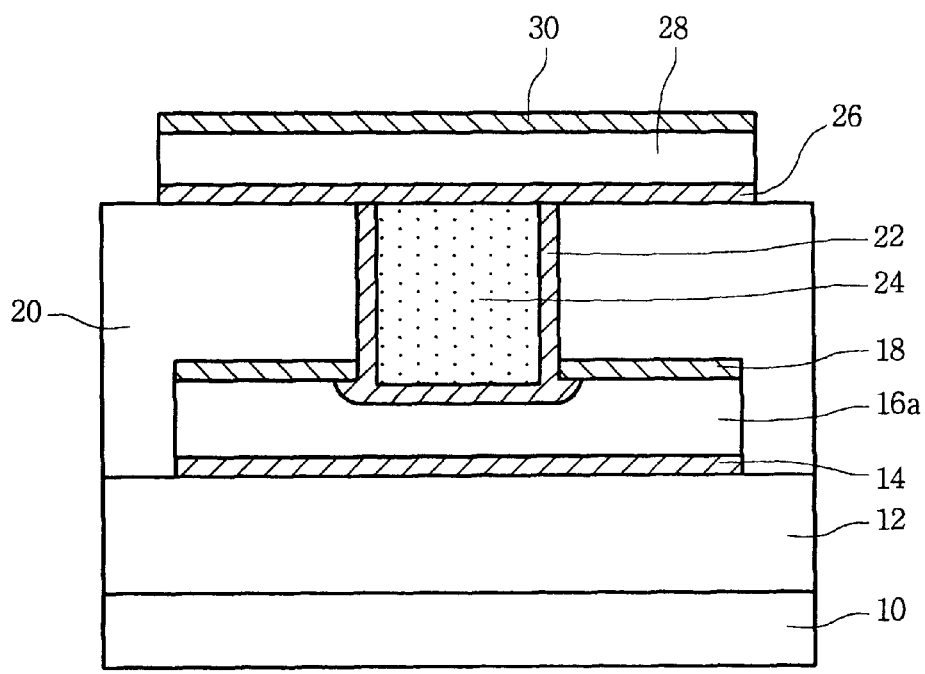

If the multi-layered wiring system is constructed as described above, concave portions (indicated by reference symbol I in FIG. 3) are not formed at the lower edges of the via hole (h). A tapered portion of the anti-reflective layer 108 is formed in the course of the wet etching process, which helps prevent formation of the concave portions and improves the sectional profile of the via hole (h). This helps to prevent the barrier metal layer and the metal wires from being disconnected at the bottom of the via hole (h). In addition, shadow points are not formed in the via hole.

As described above, a multi-layered wiring system of a semiconductor device is constructed in the Ti/TiN deposition structure by using a sputter etching device having a collimator, or by using an IMP method. In accordance with the present invention, defects are reduced (for example, concave portions formed inside the anti-reflective layer positioned at the edges of the bottom of the via hole (h) or shadow points formed in the via hole (h), particularly in the course of the wet etching process to remove the polymer component), reducing the contact resistance of the via hole (h) to >1.0 (Ω/CNT), and improving the functional effectiveness and reliability of the semiconductor device.

Having described a preferred embodiment of the present invention with reference to the accompanying drawings, it is to be understood that the invention is not limited to the presented embodiment, and that various changes and modifications may be effected therein by one skilled in the art without departing from the scope or spirit of the invention as defined in the appended claims.

We claim:

1. A method of fabricating a multi-layered wiring system of a semiconductor device, the method comprising the steps of:

forming first and second conductive layers on a semiconductor substrate having a first insulation layer;

forming an anti-reflective layer in the structure of Ti/TiN deposition layer by means of a sputter device having a collimator on the second conductive layer;

selectively etching predetermined portions of the anti-reflective layer, the second conductive layer and the first conductive layer to expose predetermined portions of the first insulation layer to form a metal wire, the metal wire having the deposition structure of the anti-reflective layer/the second conductive layer/the first conductive layer;

forming a second insulation layer;

forming a via hole by dry-etching predetermined portions of the second insulation layer and the anti-reflective layer to expose predetermined portions of the surface of the metal wire and forming a tapered portion of the anti-reflective layer remaining substantially along the edges of the via hole and substantially near a bottom surface thereof;

performing a wet etching process to remove polymer components from the via hole;

performing an RF sputter etching process to remove oxide from the metal wire and the tapered portion of the anti-reflective layer;

forming a conductive plug inside the via hole;

forming a third conductive layer of Ti on the conductive plug and a second insulation layer;

forming a fourth conductive layer from the group consisting of Al alloy and Cu alloy on top of the third conductive layer;

forming a second anti-reflective layer comprising Ti and TiN deposition layers; and forming a second metal wire that has the second anti-reflective layer at the upper portion thereof and the third conductive layer at the lower portion thereof.

2. The method, as defined in claim 1, wherein the first insulation layer comprises a BPSG single layer structure.

3. The method, as defined in claim 1, wherein the first insulation layer comprises a PEOX/USG/PE-TEOS three deposition layer structure.

4. The method, as defined in claim 1, wherein the first insulation layer comprises a PEOX/O3-TEOS/PE-TEOS/PEOX four deposition layer structure.

5. The method, as defined in claim 1, wherein the first insulation layer is 0.5–2.0 μm in thickness.

6. The method, as defined in claim 1, wherein the first conductive layer comprises a Ti/TiN deposition layer structure.

7. The method, as defined in claim 1, wherein the second conductive layer comprises an Al alloy of 5000–8000 Å in thickness.

8. The method, as defined in claim 1, wherein the second conductive layer comprises a Cu alloy of 5000–8000 Å in thickness.

9. The method, as defined in claim 1, wherein the anti-reflective layer comprises Ti and TiN, respectively of 50–500 Å and 100–1500 Å in thickness.

10. The method, as defined in claim 1, wherein the second insulation layer comprises a PEOX/O3-TEOS double layer structure.

11. The method, as defined in claim 1, wherein the second insulation layer comprises a PE-TEOS/SOG/PEOX three deposition layer structure.

12. The method, as defined in claim 1, wherein the second insulation layer comprises a PEOX/O3-TEOS/PE-TEOS/PEOX four deposition layer structure.

13. The method, as defined in claim 1, wherein the second insulation layer is 0.5–2.0 μm in thickness.

14. The method, as defined in claim 1, wherein the first insulation layer and the second insulation layer comprises an O3-TEOS/PE-TEOS/structure.

15. The method, as defined in claim 1, wherein the dry etching process is carried out by using an etching gas of $CHF_3$: $CF_4$ composed at the ratio of 1: (0.5–2.0).

16. The method, as defined in claim 1, wherein the wet etching uses an etching liquid of $HNO_3$ based solution.

17. The method, as defined in claim 1, wherein a horizontal distance from the side of a via hole to the end of the tapered portion of the anti-reflective layer is within the range of 100–800 Å.

18. The method, as defined in claim 1, wherein the amount of the oxide layer to be etched in the RF sputter etching process is 100–1000 Å in thickness with reference to an oxide layer of $SiO_2$ and the etching is performed with an RF power of 500–1500 Watts.

19. The method, as defined in claim 1, wherein the steps of forming the conductive plug in the via hole comprise:

forming a conductive layer on the second insulation layer to fill the inside of the via hole; and planarizing the conductive layer until the surface of the second insulation layer is exposed.

20. The method, as defined in claim 19, wherein the conductive layer inside the via hole comprises W.

21. The method, as defined in claim 19, wherein the conductive layer inside the via hole is planarized by a CMP process.

22. The method, as defined in claim 19, wherein the conductive layer inside the via hole is planarized by an etch back process.

23. The method, as defined in claim 19, wherein the method further comprises the step of forming a barrier metal layer on the second insulation layer.

24. The method, as defined in claim 23, wherein the barrier metal layer comprises a Ti/TiN deposition layer structure.

25. The method, as defined in claim 1, wherein the second insulation layer is etched to form a substantially vertical sectional profile and the anti-reflective layer is etched to form a substantially tapered sectional profile.

26. The method, as defined in claim 25, wherein the tapered portion of the anti-reflective layer is defined by (1) a distance X, representing a horizontal distance from the side edges of the via hole to the end of the tapered portion on the first anti-reflective layer, and (2) a distance Y, representing a total thickness of the first anti-reflective layer; whereby (3) an angle θ, corresponding to the horizontal distance X and the vertical distance Y, is kept within a range of 20–80° by controlling the thickness of the Ti and TiN of the anti-reflective layer.

27. The method, as defined in claim 26, wherein the horizontal distance X of the anti-reflective layer is kept within the range of 100–800 Å during the wet etching process.

28. A method of fabricating a multi-layered wiring system of a semiconductor device, the method comprising the steps of:

sequentially forming first and second conductive layers on a semiconductor substrate having a first insulation layer;

forming an anti-reflective layer in the structure of a Ti/TiN deposition layer by an IMP method on the second conductive layer;

selectively etching predetermined portions of the anti-reflective layer, the second conductive layer and the first conductive layer to expose predetermined portions of the first insulation layer to form a metal wire, the metal wire having the deposition structure of the anti-reflective layer/the second conductive layer/the first conductive layer;

forming a second insulation layer;

forming a via hole by dry-etching predetermined portions of the second insulation layer and the anti-reflective layer to expose predetermined portions of the surface of the metal wire and forming a tapered portion of the anti-reflective layer remaining substantially along the edges of the via hole and substantially near a bottom surface thereof;

performing a wet etching process to remove polymer components from the via hole;

performing an RF sputter etching process to remove oxide from the metal wire and the tapered portion of the anti-reflective layer; and forming a conductive plug inside the via hole.

29. The method according to claim 28, wherein the first insulation layer is 0.5–2.0 μm in thickness;

wherein the first conductive layer compresses a Ti/TiN deposition layer structure;

wherein the second conductive layer comprises an alloy from the group consisting of Al and Cu and is of 5000–8000 Å in thickness;

wherein the anti-reflective layer comprises Ti and TiN, respectively of 50–500 Å and 100–1500 Å in thickness;

wherein the second insulation layer is 0.5–2.0 μm in thickness;

wherein the dry etching process is carried out by using an etching gas of $CHF_3$: $CF_4$ composed at the ratio of 1: (0.5–2.0);

wherein the wet etching uses an etching liquid of $HNO_3$ based solution;

wherein a horizontal distance from the side of a via hole to the end of the tapered portion of the anti-reflective layer is within the range of 100–800 Å;

wherein the steps of forming the conductive plug in the via hole further comprise the steps of:

forming a conductive layer on the second insulation layer to fill the inside of the via hole;

planarizing the conductive layer until the surface of the second insulation layer is exposed;

wherein the method further comprises the step of forming a barrier metal layer on the second insulation layer comprising a Ti/TiN deposition layer structure; and wherein the second insulation layer is etched to form a substantially vertical sectional profile and the anti-reflective layer is etched to form a substantially tapered sectional profile.

30. The method according to claim 29, wherein the tapered portion of the anti-reflective layer is defined by (1) a distance X, representing a horizontal distance from side edges of the via hole to the end of the tapered portion on the first anti-reflective layer, and (2) a distance Y, representing a total thickness of the first anti-reflective layer; whereby (3) an angle θ, corresponding to the horizontal distance X and the vertical distance Y, is kept within a range of 20–80° by controlling the thickness of Ti and TiN of the anti-reflective layer; and wherein the horizontal distance X of the anti-reflective layer is kept within the range of 100–800 Å during the wet etching process.

31. A method of fabricating a multi-layered wiring system of a semiconductor device, the method comprising the steps of:

forming a first insulation layer of 0.5–2.0 μm in thickness;

forming a first conductive layer comprising a Ti/TiN deposition layer structure on the first insulation layer, wherein the Ti and TiN layers of the first conductive layer are respectively 150–250 Å and 650–750 Å in thickness;

forming a second conductive layer of 5000–8000 Å in thickness on the first conductive layer;

forming a first anti-reflective layer having a deposition layer structure of Ti/TiN on the second conductive layer, wherein the Ti and TiN layers of first anti-reflective layer are respectively 50–500 Å and 100–1500 Å in thickness;

etching the first anti-reflective layer, the second conductive layer and the first conductive layer, thereby forming a first metal wire;

forming a second insulation layer of 1.0–2.5 μm in thickness on the first insulation layer and the first metal wire;

planarizing the second insulation layer to expose predetermined portions of the first metal wire and predetermined portions of the second insulation layer and the first anti-reflective layer;

forming a via hole of 0.45–0.50 μm in thickness inside the second insulation layer;

wherein the second insulation layer is etched to form a substantially vertical sectional profile and the first anti-reflective layer is etched to form a substantially tapered sectional profile; thereby forming a tapered portion of the first anti-reflective layer which is positioned along edges of, and substantially near a bottom surface of, the via hole;

wherein the tapered portion is defined by (1) a distance X, representing a horizontal distance from the edges of the via hole to the end of the tapered portion on the first anti-reflective layer, and (2) a distance Y, representing a total thickness of the first anti-reflective layer; whereby (3) an angle θ, corresponding to the vertical distance Y of the first anti-reflective layer, is kept within a range of 20–80° by controlling the thickness of Ti and TiN of the first anti-reflective layer;

wet etching any polymer formed on the second insulation inter layer and the first anti-reflective layer, wherein the wet etching is performed in an $HNO_3$ based solution as the etching liquid;

sputter etching with an RF bias to remove oxide on the surface of the first metal wire, whereby the tapered portion of the first anti-reflective layer is substantially removed in the RF sputter etching process;

forming a barrier metal layer of Ti/TiN inside the via hole and on the second insulation layer;

forming a conductive plug inside the via hole;

forming a third conductive layer of Ti on the conductive plug and a second insulation layer;

forming a fourth conductive layer from the group consisting of Al alloy and Cu alloy on top of the third conductive layer;

forming a second anti-reflective layer comprising Ti and TiN deposition layers; and etching the second anti-reflective layer, the fourth conductive layer and the third conductive layer, to form a second metal wire.

32. The method, as defined in claim 31, wherein the horizontal distance X of the first anti-reflective layer is kept within the range of 100–800 Å in the course of the wet etching process.

33. The method, as defined in claim 32, wherein the first anti-reflective layer is formed by using an IMP method.

34. The method, as defined in claim 32, wherein the first anti-reflective layer is formed by using a sputter device having a collimator.

35. The method, as defined in claim 32, wherein the second anti-reflective layer is formed with an IMP method.

36. The method, as defined in claim 32, wherein the second anti-reflective layer is formed with a sputter device having a collimator.

37. The method, as defined in claim 31, wherein the contact resistance of the via hole is<1.0 ($\Omega$/CNT) and the via hole is dry-etched using an etching gas composed of $CHF_3$: $CF_4$ at the ratio of 1: (0.5–2.0).

38. The method, as defined in claim 32, wherein the contact resistance of the via hole is<1.0 ($\Omega$/CNT) and the via hole is dry-etched using an etching gas composed of $CHF_3$: $CF_4$ at the ratio of 1: (0.5–2.0).

* * * * *